(12) United States Patent
Kamada

(10) Patent No.: US 6,654,929 B1
(45) Date of Patent: Nov. 25, 2003

(54) VITERBI DECODER AND VITERBI DECODING METHOD

(75) Inventor: Takehiro Kamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 408 days.

(21) Appl. No.: 09/672,904

(22) Filed: Sep. 29, 2000

(30) Foreign Application Priority Data

Oct. 1, 1999 (JP) ............................................. 11-281302

(51) Int. Cl.[7] ............................................. H03M 13/03
(52) U.S. Cl. .................... 714/795; 714/792; 714/794; 714/796; 375/262; 375/341
(58) Field of Search .................. 714/795, 792, 714/794, 796; 375/262, 341

(56) References Cited

U.S. PATENT DOCUMENTS

| | | | | |
|---|---|---|---|---|
| 4,583,078 A | * | 4/1986 | Shenoy et al. ................. | 341/51 |
| 4,777,636 A | * | 10/1988 | Yamashita et al. ........... | 714/795 |
| 4,905,317 A | * | 2/1990 | Suzuki et al. ................. | 341/51 |
| 5,390,198 A | * | 2/1995 | Higgins ...................... | 714/796 |
| 5,446,746 A | * | 8/1995 | Park ........................... | 714/795 |
| 5,509,021 A | | 4/1996 | Todoroki | |
| 5,946,361 A | * | 8/1999 | Araki et al. ................. | 375/341 |
| 5,987,637 A | * | 11/1999 | Thomas ....................... | 714/795 |
| 5,991,341 A | * | 11/1999 | Shin ............................ | 375/265 |
| 5,991,343 A | * | 11/1999 | Oh et al. ...................... | 375/341 |
| 6,031,876 A | * | 2/2000 | Oh et al. ...................... | 375/265 |
| 6,041,433 A | | 3/2000 | Kamada | |
| 6,094,739 A | * | 7/2000 | Miller et al. ................. | 714/792 |
| 6,269,129 B1 | * | 7/2001 | Rhee et al. ................... | 375/341 |
| 6,337,890 B1 | * | 1/2002 | Maru ........................... | 375/341 |
| 6,385,753 B1 | * | 5/2002 | Hatakeyama ............... | 714/796 |
| 6,408,420 B1 | * | 6/2002 | Todoroki ..................... | 714/795 |
| 6,452,985 B1 | * | 9/2002 | Hatakeyama et al. ....... | 375/341 |
| 6,477,208 B1 | * | 11/2002 | Huff ............................ | 375/265 |
| 2001/0049809 A1 | * | 12/2001 | Miyauchi et al. ........... | 714/796 |

FOREIGN PATENT DOCUMENTS

| | | | | |
|---|---|---|---|---|
| EP | 967730 A1 | * | 12/1999 | ............ H03M/13/00 |
| JP | 06104942 | | 4/1994 | |
| JP | 11186915 | | 7/1999 | |
| JP | 11186919 | | 7/1999 | |
| JP | 11186920 | | 7/1999 | |

\* cited by examiner

*Primary Examiner*—Albert Decady
*Assistant Examiner*—Joseph D. Torres
(74) *Attorney, Agent, or Firm*—McDermott, Will & Emery

(57) ABSTRACT

In the Viterbi decoder for decoding a trellis-coded modulated signal of this invention, a path memory is constructed of a general RAM, whereby the circuit size and power consumption are reduced. A trace-back section traces back path select signals stored in a trace-back memory by a predetermined length. Using the number of a node through which a most likely path passes obtained by the tracing back and in accordance with a trellis diagram, a subset number generator section outputs coding bits relating to transition to the node concerned and a subset number. A selector section selectively outputs a noncoding bit relating to the transition to the node based on the subset number.

4 Claims, 15 Drawing Sheets

Fig. 3

| ND2\ND1 | 000 | 001 | 010 | 011 | 100 | 101 | 110 | 111 |
|---|---|---|---|---|---|---|---|---|
| 000 | 00/0 | 10/4 | 01/2 | 11/6 | / | / | / | / |
| 001 | / | / | / | / | 00/1 | 10/5 | 01/3 | 11/7 |
| 010 | 10/4 | 00/0 | 11/6 | 01/2 | / | / | / | / |
| 011 | / | / | / | / | 10/5 | 00/1 | 11/7 | 01/3 |
| 100 | 01/2 | 11/6 | 00/0 | 10/4 | / | / | / | / |
| 101 | / | / | / | / | 01/3 | 11/7 | 00/1 | 10/5 |
| 110 | 11/6 | 01/2 | 10/4 | 00/0 | / | / | / | / |
| 111 | / | / | / | / | 11/7 | 01/3 | 10/5 | 00/1 |

CB{x2, x1}/SSN0

Fig. 9

| ND2\ND1 | 000 | 001 | 010 | 011 | 100 | 101 | 110 | 111 |
|---|---|---|---|---|---|---|---|---|
| 000 | 00/0 | 10/9 | 01/4 | 11/13 | / | / | / | / |
| 001 | / | / | / | / | 00/2 | 10/11 | 01/6 | 11/15 |
| 010 | 10/8 | 00/1 | 11/12 | 01/5 | / | / | / | / |
| 011 | / | / | / | / | 10/10 | 00/3 | 11/14 | 01/7 |
| 100 | 01/4 | 11/13 | 00/0 | 10/9 | / | / | / | / |
| 101 | / | / | / | / | 01/6 | 11/15 | 00/2 | 10/11 |
| 110 | 11/12 | 01/5 | 10/8 | 00/1 | / | / | / | / |
| 111 | / | / | / | / | 11/14 | 01/7 | 10/10 | 00/3 |

CB{x2, x1}/SSN0

VITERBI DECODER AND VITERBI DECODING METHOD

BACKGROUND OF THE INVENTION

The present invention relates to a technique on Viterbi decoding for decoding a trellis-coded modulated signal.

As a conventional configuration for decoding a trellis-coded modulated signal, a Viterbi decoder as shown in FIG. 13 has been proposed (Japanese Laid-Open Patent Publication No. 5-335972; corresponding U.S. Pat. No. 5,509,021).

FIG. 11 shows a trellis encoder that generates the trellis-coded modulated signal to be decoded by the above conventional decoder. FIG. 12 is a trellis diagram for the trellis encoder in FIG. 11. The trellis encoder in FIG. 11 has an encoding rate of ¾ with one noncoding bit and a constraint length of 4. Therefore, this trellis encoder has $2^{(4-1)}=8$ states that are represented by values of registers D2, D1, and D0 of the encoder, that is, {000}, {001}, {010}, {011}, {100}, {101}, {110}, and {111}. In addition, the values of outputs {y2, y1, y0} of the encoder constitute a subset, and the value of this bit string as binary notation is herein defined as the number of this subset. For example, if {y2, y1, y0}={1, 0, 1}, the subset number is "5", and this subset is referred to as "subset s5". Such subsets s0 through s7 are called subsets A through H in the aforementioned prior art.

The operation of the Viterbi decoder in FIG. 13 is as follows.

A branch metric generator 601 determines Euclidean distances between a reception signal point and respective transmission symbol points, and outputs the results as branch metrics "BMs" ("s" denotes any of the subset numbers 0 to 7). One subset includes two transmission symbol candidates. A branch metric corresponding to the transmission symbol string of which the noncoding bit is "0" is denoted by $BMs_0$, while a branch metric corresponding to the transmission symbol string of which the noncoding bit is "1" is denoted by $BMs_1$.

A subset maximum likelihood estimator 602 selects one of the two transmission symbol candidates of each subset that has a smaller Euclidean distance, and outputs the selected one as the branch metric BMs for the subset concerned.

A noncoding bit detector 603 extracts the noncoding bit in each selected transmission symbol candidate based on the selection information output from the subset maximum likelihood estimator 602, and outputs the extracted noncoding bit. The noncoding bits are then delayed by j-level shift registers 604 by j levels that correspond to the number of delay levels in a path memory circuit 607.

An add-compare-select (ACS) circuit 605 adds the branch metrics output from the subset maximum likelihood estimator 602 to path metrics of survivor paths in each state at time t−1, that is, in a state before transition to a state at time t in the trellis diagram shown in FIG. 12. The ACS circuit 605 then selects one of the added values that has the highest likelihood as a path metric PM0 to PM7 of the survivor path. Simultaneously, the selection information is output as a select signal PS0 to PS7.

FIG. 14 is a block diagram of a basic unit of the ACS circuit. For simplifying the description, FIG. 14 illustrates only a basic unit corresponding to state i. In the case of the above conventional decoder, since the number of states is 8, a total of eight basic units with the configuration shown in FIG. 14 are arranged in parallel in the ACS circuit 605.

Adders 700a to 700d receive path metrics PMa to PMd and branch metrics BMa to BMd in accordance with the trellis diagram shown in FIG. 12. The respective added results a to d are input into a comparator 701. The comparator 701 compares the added results a to d, selects one having the highest likelihood, and outputs a select signal PSi representing the selected result. Specifically, if the added result a is selected, "0" is output. Likewise, if the added results b, c, and d are selected, "1", "2", and "3" are output, respectively. A selector 702 receives the added results a to d and the select signal PSi, and outputs to a register 703 one of the added results that corresponds to the select signal PSi as a new path metric PMi for state i.

The order of {(PMa,BMa), (PMb,BMb), (PMc,BMc), (PMd,BMd)} input into the basic unit is set as follows for the respective states in the above conventional decoder.

<State 0>
{(PM0,BM0), (PM2,BM4), (PM4,BM2), (PM6,BM6)}
<State 1>
{(PM0,BM4), (PM2,BM0), (PM4,BM6), (PM6,BM2)}
<State 2>
{(PM0,BM2), (PM2,BM6), (PM4,BM0), (PM6,BM4)}
<State 3>
{(PM0,BM6), (PM2,BM2), (PM4,BM4), (PM6,BM0)}
<State 4>
{(PM1,BM1), (PM3,BM5), (PM5,BM3), (PM7,BM7)}
<State 5>
{(PM1,BM5), (PM3,BM1), (PM5,BM7), (PM7,BM3)}
<State 6>
{(PM1,BM3), (PM3,BM7), (PM5,BM1), (PM7,BM5)}
<State 7>
{(PM1,BM7), (PM3,BM3), (PM5,BM5), (PM7,BM1)}

The path select signals PS0 to PS7 output from the ACS circuit 605 are input into the path memory 607. FIG. 15 illustrates the path memory 607, which is basically configured to concretize the transitions to respective nodes in the trellis diagram. Registers disposed at positions corresponding to the nodes store values selected among those output from the immediately preceding registers in accordance with the respective path select signals PS0 to PS7.

At the first level, the subset number itself is selected by the path select signal PSi. Accordingly, the subset numbers at each branch in the trellis diagram in FIG. 12 are input into a selector 800. For example, in state 0, when the path select signal PS0 is "0", (PM0,BM0) has been selected. Therefore, the selector 800 outputs the subset number "0", which is stored in a register 801. Likewise, when the path select signal PS0 is "1", "2", and "3", the selector 800 outputs the subset number "4", "2", and "6", respectively. In states 1 to 7, also, the selector 800 outputs a subset number x corresponding to each of the path select signals PS1 to PS7. The output results are stored in the respective registers 801.

At the second level, a value stored in a register corresponding to the node number at the first level is selected. For example, in state 0, when the path select signal PS0 is "0", (PM0,BM0) has been selected. Therefore, a selector 802 outputs the content of the register corresponding to state 0 at the first level, which is then stored in a register 803. Likewise, when the path select signal PS0 is "1", "2", and "3", the selector 802 outputs the content of register 2, 4, and 6, respectively. In states 1 to 7, also, the selector 802 outputs the content of register x at the first level corresponding to the state number x represented by the value of each of the path select signals PS1 to PS7. The output results are stored in the respective registers 803.

The above configuration at the second level is repeated for the third and subsequent levels until the j-th level. In this way, values are shifted from the first level through the j-th level for j clocks. Thus, a value stored in register n at the j-th level is equal to the subset number in the state through which the survivor path in state n has passed j time points earlier. The outputs from the registers at the j-th level are input into a selector 608.

A most likely path decision circuit 606 receives the outputs PM0 to PM7 from the registers of the respective basic units of the ACS circuit 605, detects the state having the highest likelihood among the inputs, and outputs the number of the detected state. Selector 608 receives the output of the most likely path decision circuit 606 and selects the corresponding register output value. The register output value is equal to the subset number that will be obtained by going back along the most likely path by j levels. In the case of the encoder shown in FIG. 11, the two higher-order bits of the subset number are equal to the bits of input information. Accordingly, the two higher-order bits of the subset number output from the selector 608 represent decoded coding bits (x2,x1). Further, based on the decoded subset number output from the selector 608, a selector 609 selects a noncoding bit x3 delayed by j levels for the subset number. The noncoding bit x3 in combination with the coding bits (x2,x1) are output as the decoding results of the Viterbi decoder.

The above conventional configuration has the following problems.

First, used conventionally as the path memory is the configuration as shown in FIG. 15 composed of combinations of selectors and registers, just concretizing the trellis diagram. Accordingly, if the truncation length (j levels in this case) increases or the number of states in the encoder increases, the circuit size of the path memory markedly increases. This results in significant increase in the circuit area of the entire device and power consumption.

Secondly, in the path memory as shown in FIG. 15, connections to the respective selectors are unique to a specific encoder. It is therefore difficult to configure a general-purpose decoder usable for different encoders.

Thirdly, the path memory conventionally stores subset numbers themselves. With this configuration, when the encoding rate of a trellis encoder is reduced by increasing the number of bits of a code from 3 to 4 or even 5, for example, the number of bits of each subset number increases thereby increasing the number of bits stored in the path memory. This also results in increase in the circuit area of the entire device.

SUMMARY OF THE INVENTION

Objects of the present invention are providing a Viterbi decoder and a Viterbi decoding method for decoding a trellis-coded modulated signal, where a path memory is configured of a general RAM thereby reducing the circuit size and power consumption.

Specifically, the present invention provides a Viterbi decoder for decoding a trellis-coded modulated signal including: a subset selector section for receiving a reception signal, selecting a transmission symbol having the highest likelihood with respect to a reception symbol point for each subset, and outputting a branch metric corresponding to the selected transmission symbol and a subset select signal for specifying the selected transmission symbol; delays for delaying the subset select signals for a predetermined time; an add-compare-select (ACS) section for receiving the branch metrics, performing arithmetic operation to obtain path metrics in accordance with a trellis diagram, and outputting path select signals for selecting paths having high likelihood; a trace-back memory for storing the path select signals; a trace-back section for tracing back the path select signals stored in the trace-back memory by a predetermined trace-back length from a start node number as a start point; a subset number generator section for outputting, using the number of a first node through which a most likely path passes obtained by the trace-back section and in accordance with a trellis diagram, coding bits relating to transition to the first node and a subset number; and a selector section for receiving the subset number and the subset select signals output from the delays and outputting a noncoding bit relating to the transition to the first node, wherein the coding bits output from the subset number generator section and the noncoding bit output from the selector section are combined to produce a decoded signal.

The subset number generator section preferably generates the coding bits and the subset number using the first node number and a second node number through which the most likely path has passed one time point before the first node.

Alternatively, the subset number generator section preferably generates the coding bits and the subset number using the first node number and a path select signal corresponding to the first node.

According to another aspect of the invention, a Viterbi decoding method for decoding a trellis-coded modulated signal is provided. The method includes the steps of: selecting a transmission symbol having the highest likelihood with respect to a reception symbol point for each subset based on a reception signal, to generate a branch metric corresponding to the selected transmission symbol and a subset select signal for specifying the selected transmission symbol; delaying the subset select signals for a predetermined time; performing add-compare-select (ACS) operation including receiving the branch metrics, performing arithmetic operation to obtain path metrics in accordance with a trellis diagram, and out-putting path select signals for selecting paths having high likelihood; storing the path select signals in a trace-back memory; tracing back the path select signals stored in the trace-back memory by a predetermined trace-back length from a start node number as a start point; generating, using the number of a first node through which a most likely path passes obtained by the tracing back and in accordance with a trellis diagram, coding bits relating to transition to the first node and a subset number; and selecting a noncoding bit relating to the transition to the first node based on the subset number and the delayed subset select signals, wherein the coding bits and the noncoding bit are combined to produce a decoded signal.

BRIEF DESCRIPTION OF THE DRAWINGS

FIG. 3 is an example of table data stored in the subset number generator in FIG. 2, prepared for signals encoded by the trellis encoder shown in FIG. 11.

FIG. 9 is another example of table data stored in the subset number generator in FIG. 2, prepared for signals encoded by the trellis encoder in FIG. 7.

DESCRIPTION OF THE PREFERRED EMBODIMENTS

Hereinafter, preferred embodiments of the present invention will be described with reference to the accompanying drawings.

Figure 1:
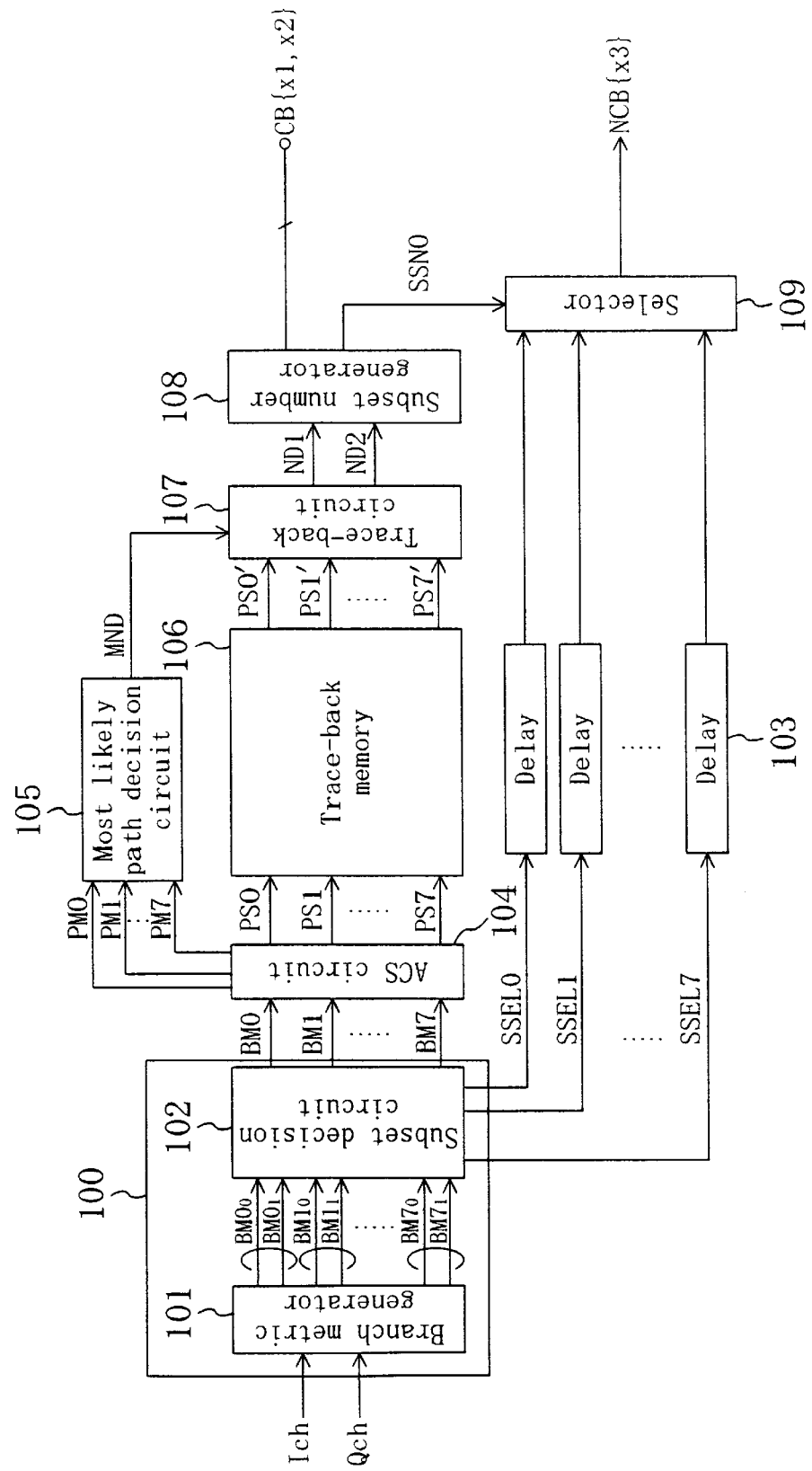
FIG. 1 is a block diagram of a Viterbi decoder of an embodiment of the present invention.
Figure 11:
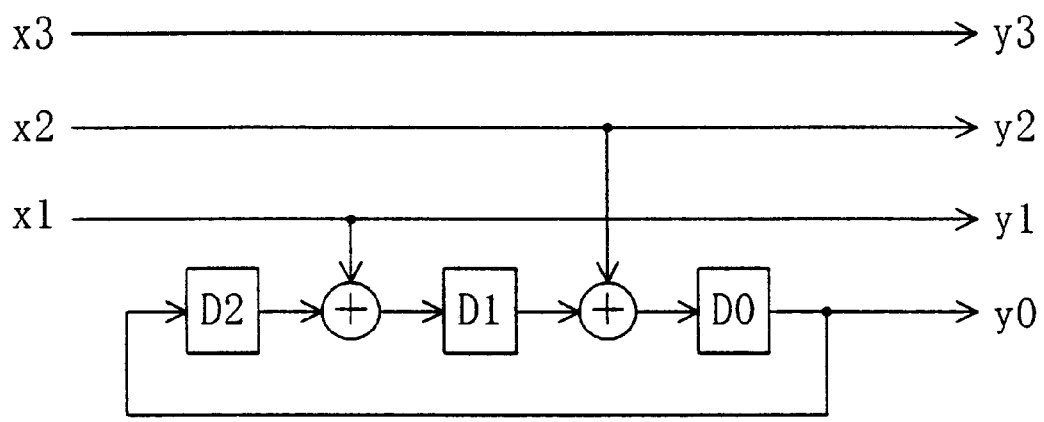
FIG. 11 illustrates another example of a trellis encoder.

FIG. 1 is a block diagram of a Viterbi decoder of an embodiment of the present invention. The Viterbi decoder shown in FIG. 1 decodes a trellis-coded modulated signal. Herein, decoding of a signal subjected to trellis coded modulation by the trellis encoder shown in FIG. 11 will be described for simplification of description. That is, the trellis encoder having the number of noncoding bits k (=1) and the encoding rate m/n (=¾) is regarded as a precondition in the following description. I-channel data Ich and Q-channel data Qch as reception signals are obtained in the following manner: Two demodulated signal strings are produced by being orthogonal-synchronous-detected, and the respective amplitude values of the two demodulated signal strings are quantized to obtain these data.

Referring to FIG. 1, a subset selector 100 includes a branch metric generator 101 and a subset decision circuit 102. The subset selector 100 receives I-channel data Ich and Q-channel data Qch, selects a transmission symbol having the highest likelihood with respect to a reception symbol point for each of $2^{(n-k)}(=2^{(4-1)}=8)$ different subsets, and outputs branch metrics BM0 to BM7 corresponding to the selected transmission symbols as well as subset select signals SSEL0 to SSEL7 for specifying the selected transmission symbols.

Figure 12:
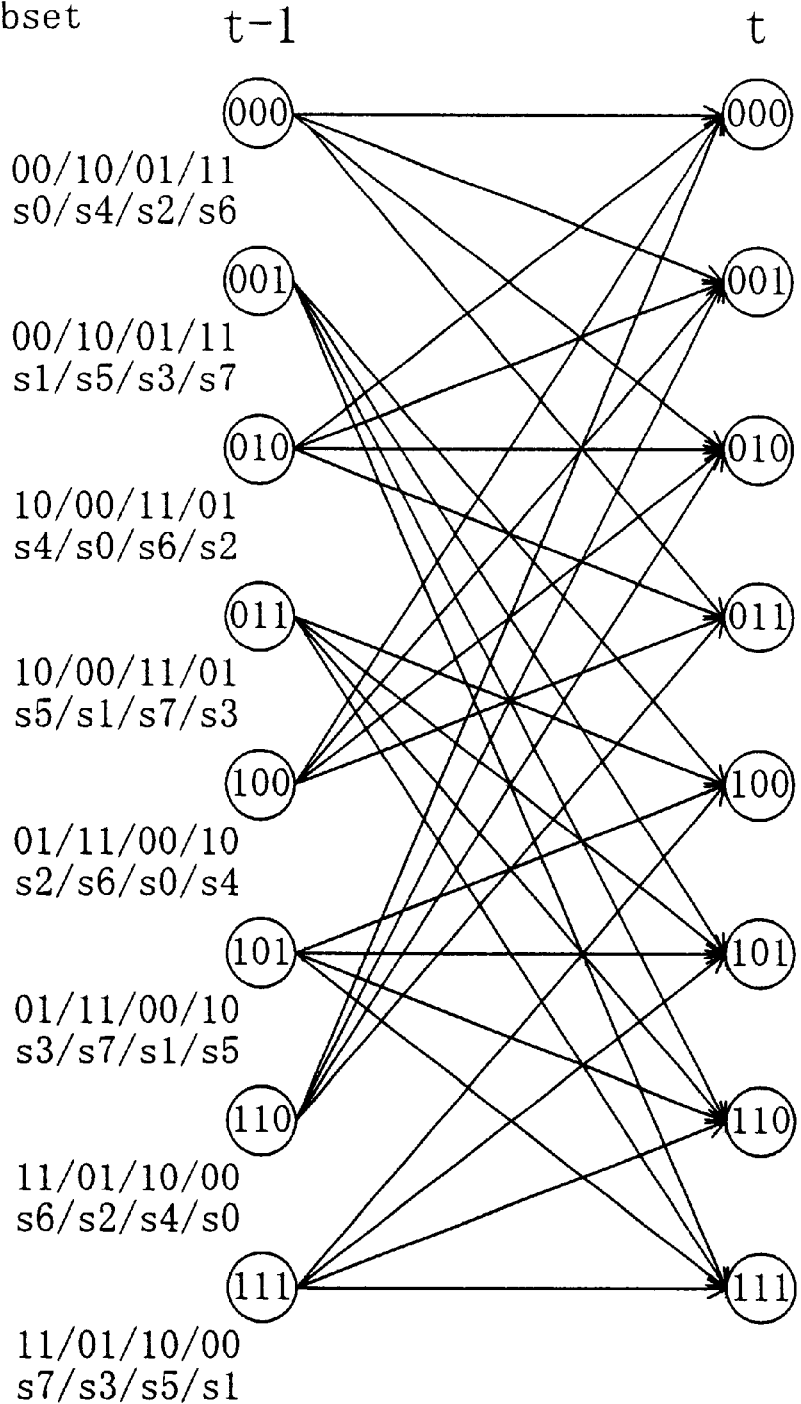
FIG. 12 is a trellis diagram for the trellis encoder in FIG. 11.
Figure 13:
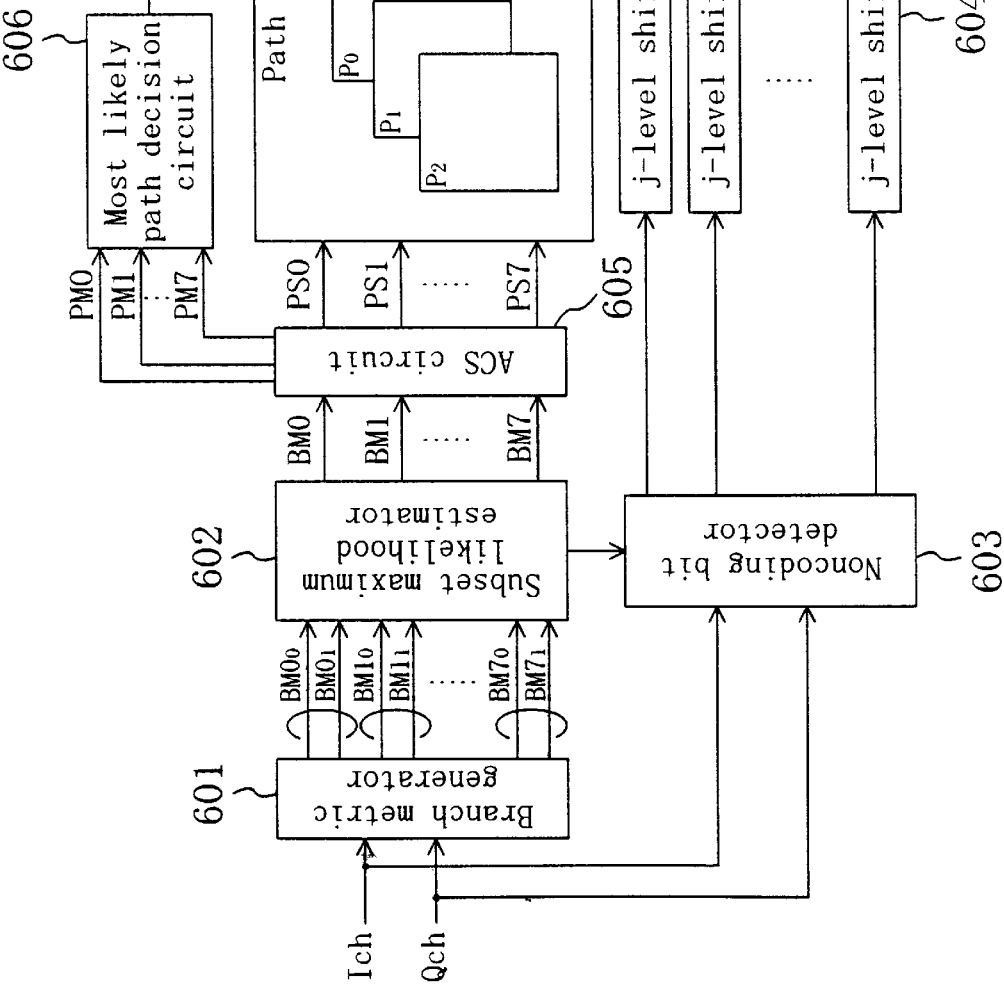
FIG. 13 is a block diagram of a conventional Viterbi decoder.

Delays 103 delay the subset select signals SSEL0 to SSEL7 output from the subset selector 100 by a predetermined time. An add-compare-select (ACS) circuit 104 receives the branch metrics BM0 to BM7 output from the subset selector 100, performs arithmetic operation to obtain path metrics PM0 to PM7 in accordance with the trellis diagram shown in FIG. 12, and outputs path select signals PS0 to PS7 for selecting paths with high likelihood. A trace-back memory 106 stores the path select signals PS0 to PS7 output from the ACS circuit 104. The trace-back memory 106 is constructed of a general RAM, for example.

A trace-back circuit 107 traces back along path select signals PS0' to PS7' stored in the trace-back memory 106 by a predetermined trace-back length starting from a start node number. A subset number generator 108 generates, using a first node number ND1 through which a most likely path passes obtained by the trace-back circuit 107 and in accordance with the trellis diagram shown in FIG. 12, coding bits CB{x1,x2} relating to the transition to the first node, as well as a subset number SSN0. A selector 109 that receives the subset select signals SSEL0 to SSEL7 delayed by the delays 103 selects and outputs a noncoding bit NCB{x3} relating to the transition to the first node based on the received subset number SSN0 output from the subset number generator 108.

A most likely path decision circuit 105 receives the path metrics PM0 to PM7 obtained by the arithmetic operation by the ACS circuit 104, detects a path with the highest likelihood among the path metrics PM0 to PM7, and outputs a node number MND through which the path passes. Based on the node number MND output from the most likely path decision circuit 105, the trace-back circuit 107 determines the start node number for tracing back.

The operation of the Viterbi decoder with the above configuration will be described.

First, in the subset selector 100, the branch metric generator 101 generates branch metrics $BMs_0$ and $BMs_1$ for each branch (s is an integer in the range of 0 to 7 indicating the subset number) from a reception signal as in the conventional case. Herein, squared Euclidean distances $(Rx-Tx)^2+(Ry-Ty)^2$ between the reception signal (Rx, Ry) and respective transmission symbols (Tx, Ty) are used as the branch metrics. The other values, $|Rx-Tx|+|Ry-Ty|$, $Rx \cdot Tx + Ry \cdot Ty$, ..., can be used for branch metrics. The subset decision circuit 102 compares the branch metrics $BMs_0$ and $BMs_1$ of each subset and selects one having higher likelihood. The subset decision circuit 102 outputs the selected branch metrics BM0 to BM7 to the ACS circuit 104, as well as the subset select signals SSEL0 to SSEL7 corresponding to the selected branch metrics to the respective delays 103.

In this embodiment, the subset selector 100 generates the subset select signals SSEL0 to SSEL7 so that they match respective noncoding bits corresponding to the selected transmission symbols. This enables the subset select signals SSEL0 to SSEL7 to be used as noncoding bits as they are without any special processing. This simplifies and facilitates the configuration of the selector 109. For each subset s, the branch metric for which the noncoding bit is "0" is denoted by $BMs_0$, while the branch metric for which the noncoding bit is "1" is denoted by $BMs_1$ as described above. Therefore, the subset select signal SSELs is "0" when the branch metric $BMs_0$ is selected while it is "1" when the branch metric $BMs_1$ is selected.

The subset select signals SSELs output from the subset decision circuit 102 are delayed by a predetermined time by the delays 103 and then output to the selector 109. The delay time by the delays 103 is equal to the time required for the series of processing from the input of the branch metrics BM0 to BM7 into the ACS circuit 104 until the generation of the subset number SSN0 by the subset number generator 108.

Figure 14:
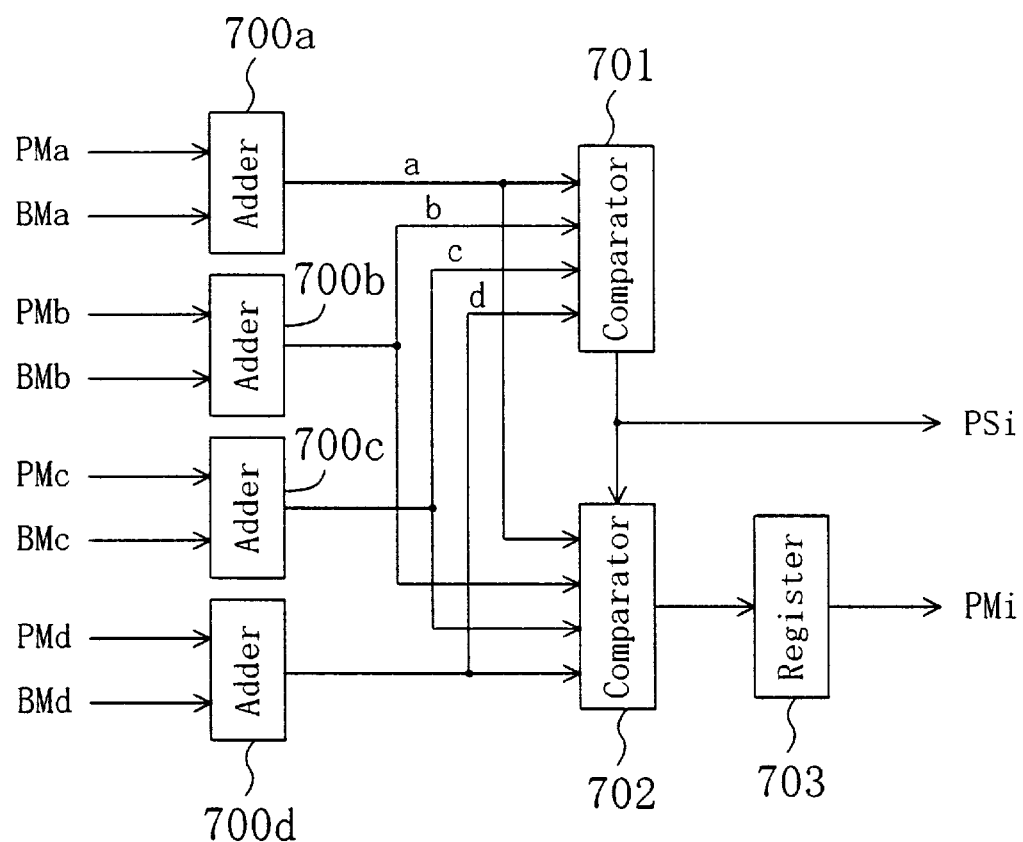
FIG. 14 is a block diagram of a basic unit constituting an ACS circuit.
Figure 15:
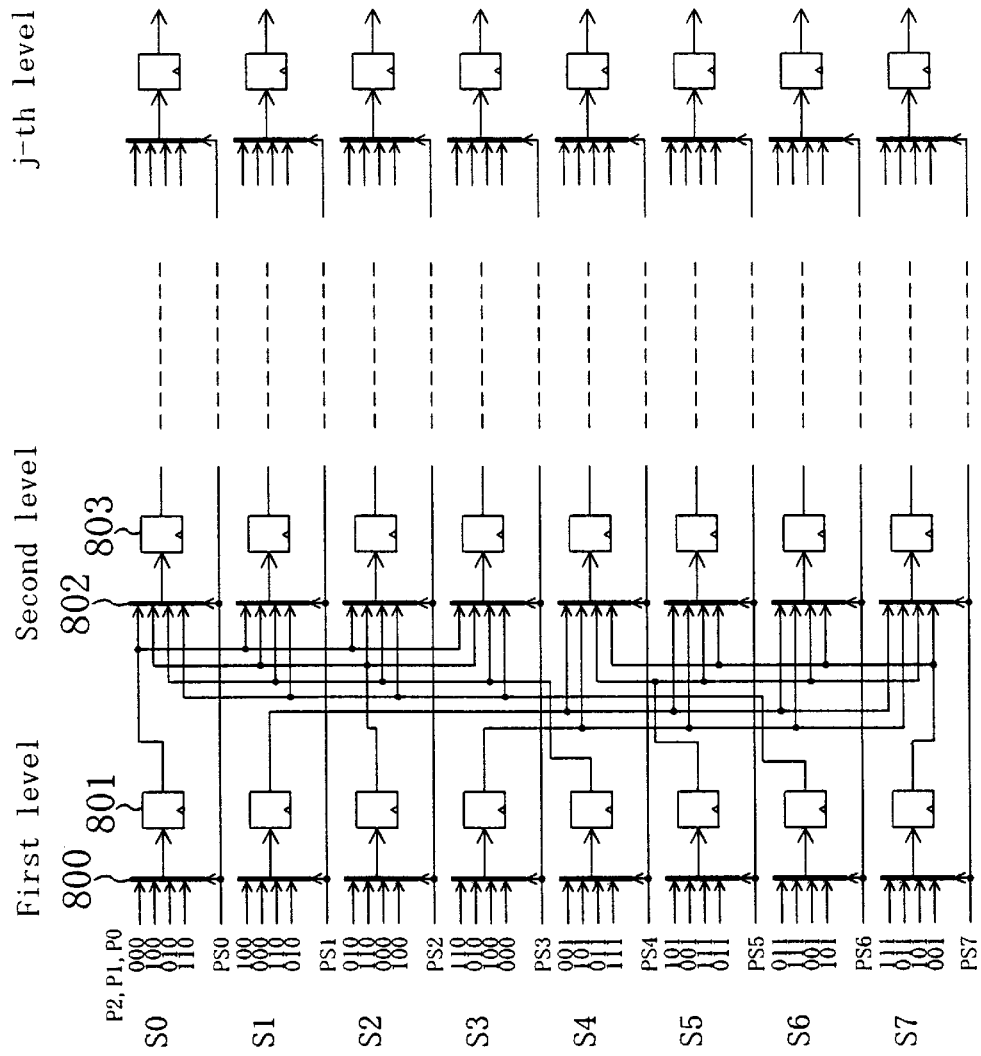
FIG. 15 illustrates a conventional path memory circuit.

The ACS circuit 104 selects paths to respective nodes using the branch metrics BMs output from the subset decision circuit 102, to update the path select signals PS0 to PS7 and the path metrics PM0 to PM7. The inner configuration of the ACS circuit 104 is substantially the same as the conventional one, but the order of {(PMa,BMa), (PMb,BMb), (PMc,BMc), (PMd,BMd)} input into the basic unit as shown in FIG. 14 is different from that in the conventional case. The order in this embodiment is as follows.

<State 0>
{(PM0,BM0), (PM4,BM2), (PM2,BM4), (PM6,BM6)}
<State 1>
{(PM2,BM0), (PM6,BM2), (PM0,BM4), (PM4,BM6)}

<State 2>

{(PM4,BM0), (PM0,BM2), (PM6,BM4), (PM2,BM6)}

<State 3>

{(PM6,BM0), (PM2,BM2), (PM4,BM4), (PM0,BM6)}

<State 4>

{(PM1,BM1), (PM5,BM3), (PM3,BM5), (PM7,BM7)}

<State 5>

{(PM3,BM1), (PM7,BM3), (PM1,BM5), (PM5,BM7)}

<State 6>

{(PM5,BM1), (PM1,BM3), (PM7,BM5), (PM3,BM7)}

<State 7>

{(PM7,BM1), (PM3,BM3), (PM5,BM5), (PM1,BM7)}

In other words, in this embodiment, the ACS operation is performed so that each path select signal matches the coding bits {x2,x1} relating to the transition of the selected path, that is, the transition to the node corresponding to the path select signal concerned.

For example, in state 0, the order of input into the basic unit is {(PM0,BM0), (PM4,BM2), (PM2,BM4), (PM6,BM6)} as described above. If the basic unit selects (PMc, BMc) (=(PM2,BM4)), the path select signal PS0 is "10". This is equal to the coding bits {x2,x1}={1,0} relating to the transition from node number 2 ({010}) to node number 0 ({000}), as is apparent from the trellis diagram shown in FIG. 12. As another example, in state 4, the order of input into the basic unit is {(PM1,BM1), (PM5,BM3), (PM3, BM5), (PM7,BM7)} as described above. If the basic unit selects (PMb,BMb) (=(PM5,BM3)), the path select signal PS4 is "01". This is equal to the coding bits {x2,x1}={0,1} relating to the transition from node number 5 ({101}) to node number 4 ({100}).

The path select signals PS0 to PS7 output from the ACS circuit 104 are stored in the trace-back memory 106.

Figure 2:
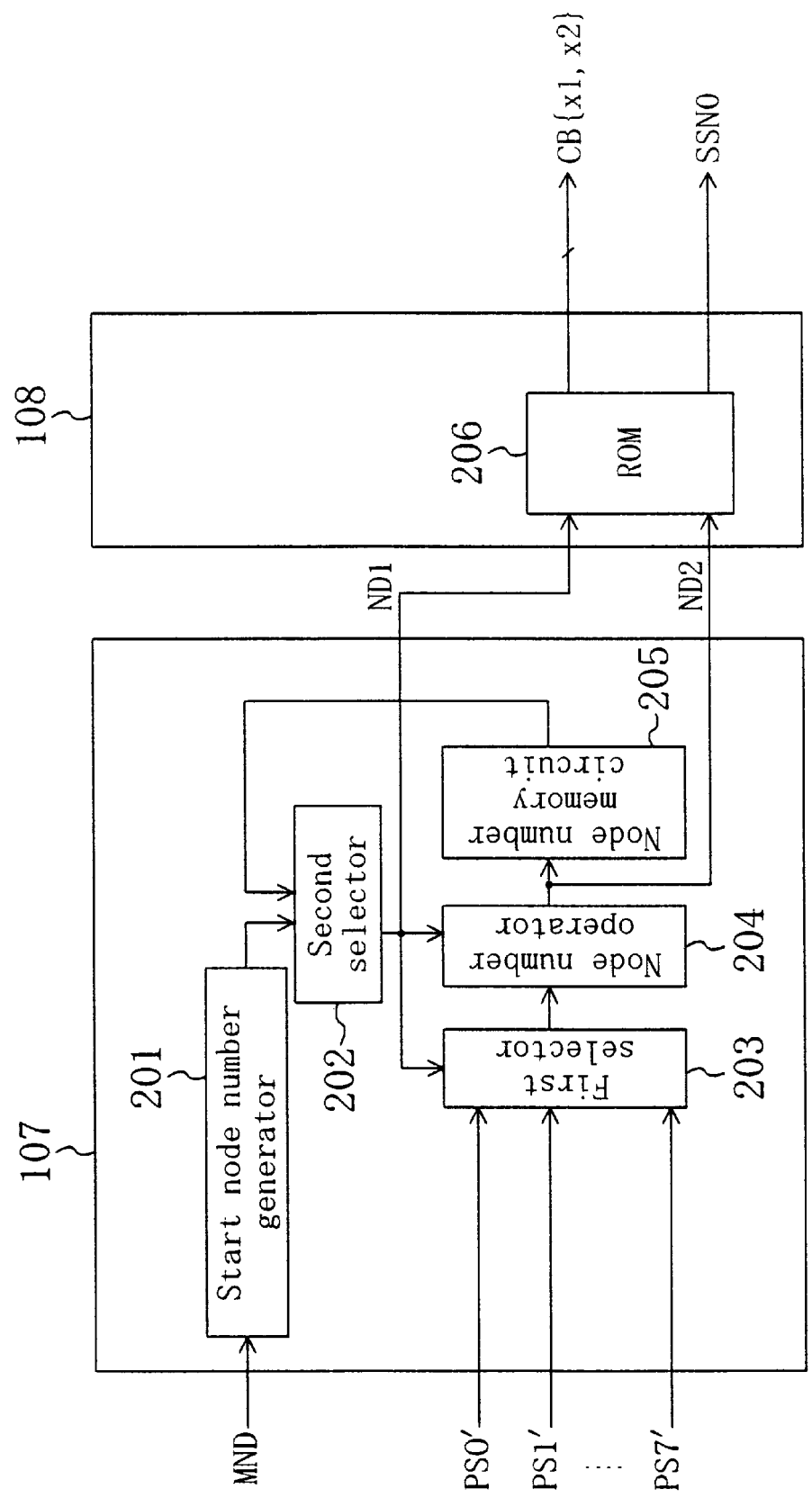
FIG. 2 is a block diagram of an example of a trace-back circuit and a subset number generator of the Viterbi decoder in FIG. 1.

FIG. 2 is a block diagram of an example of the trace-back circuit 107 and the subset number generator 108. In the illustrated configuration, the subset number generator 108 generates the coding bits CB{x1,x2} and the subset number SSNO based on the first node number ND1 through which the most likely path passes output from the trace-back circuit 107 and a second node number ND2 through which the most likely path has passed one time point before the first node. The subset number generator 108 therefore includes a ROM 206, which stores table data as shown in FIG. 3. The table data represents the relationship between the combination of the first and second node numbers ND1 and ND2 and the combination of the coding bits CB{x1,x2} and the subset number SSNO. The table data shown in FIG. 3 can be easily generated from the trellis diagram shown in FIG. 12.

Figure 4:
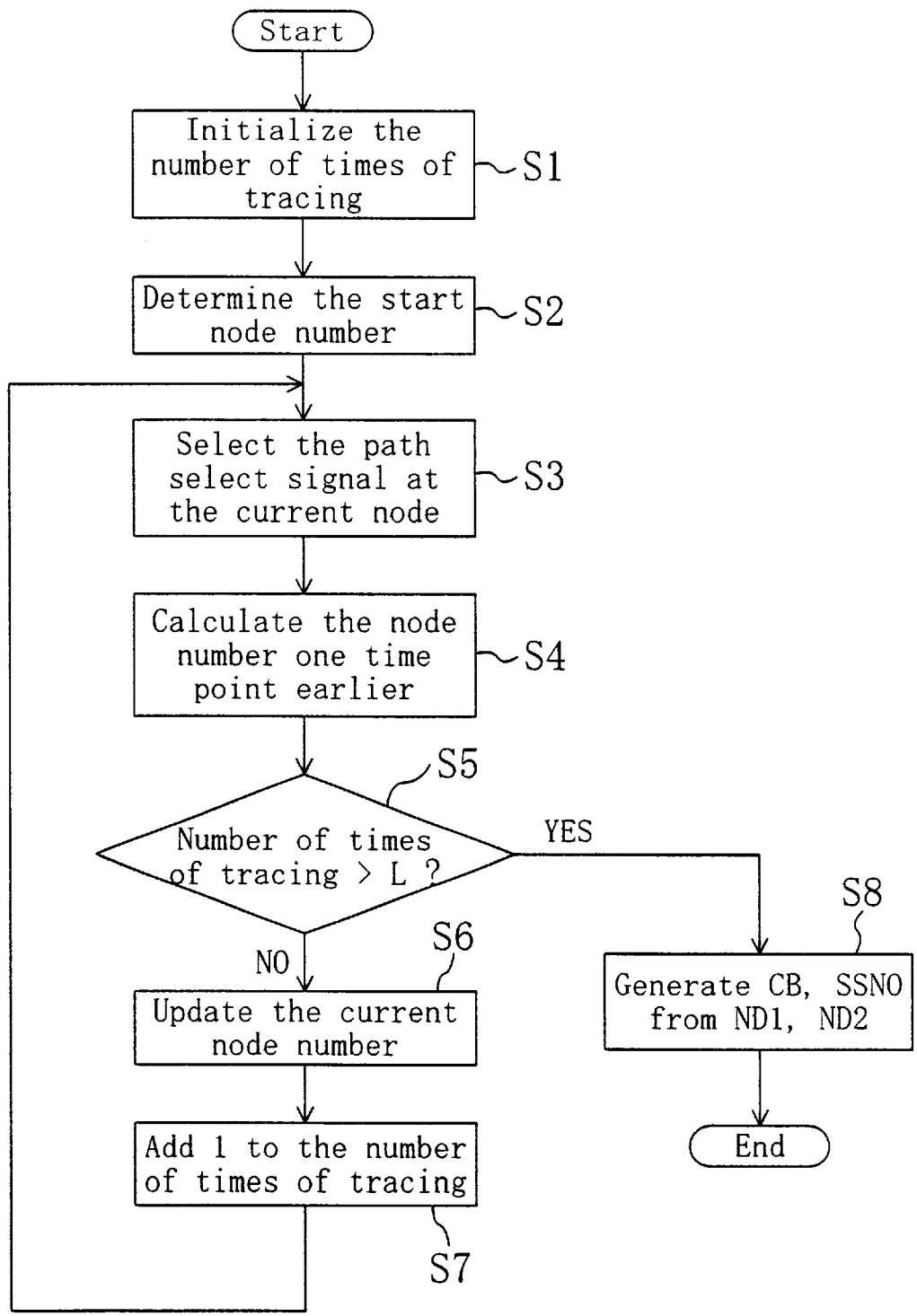
FIG. 4 is a flowchart of the operation of the trace-back circuit and the subset number generator.

FIG. 4 is a flowchart of the operation of the trace-back circuit 107 and the subset number generator 108. First, the node number MND of the most likely path output from the most likely path decision circuit 105 is input into a start node number generator 201. Based on the node number MND, the start node number generator 201 determines a start node number from which tracing back is initiated, and outputs the start node number to a second selector 202 (step S2). The second selector 202 selects the output from the start node number generator 201 at start-up of the tracing back, and outputs the selected value to a first selector 203 and a node number operator 204.

The first selector 203 selects one of the path select signals PS0' to PS7' output from the trace-back memory 106 that corresponds to the node number output from the second selector 202, and outputs the selected signal to the node number operator 204 (step S3). The node number operator 204 calculates the node number one time point earlier based on the current node number output from the second selector 202 and the corresponding path select signal output from the first selector 203 (step S4).

Specifically, each path select signal has been generated so as to match the input coding bits {x2,x1} relating to the transition as described above. Accordingly, in the case of the encoder shown in FIG. 11, for the current node number {D2,D1,D0}, the node number one time point earlier, {D2', D1',D0'}, is expressed as follows.

$$D2'=D1\char`\^ x1,\ D1'=D0\char`\^ x2,\ D0'=D2 \qquad (1)$$

where "^" denotes exclusive OR. The calculated node number one time point earlier, {D2',D1',D0'}, is newly stored in a node number memory circuit 205 (step S6).

The above series of processing is repeated until the number of times of tracing reaches a predetermined trace-back length L (steps S1, S5, S7). Note that the second selector 202 selects the output from the node number memory circuit 205 storing the current node number at occasions other than the start-up of the tracing back.

As a result of the above processing, output from the trace-back circuit 107 are the first node number ND1 L time points earlier for the most likely path obtained from the tracing back and the second node cumber ND2 through which the most likely path has passed one time point before the first node. The subset number generator 108 generates the coding bits CB{x1,x2} and the subset number SSNO based on the node numbers ND1 and ND2 with reference to the table data as shown in FIG. 3 stored in the ROM 206 (step S8).

The subset number SSNO generated by the subset number generator 108 is input into the selector 109. The selector 109 selects one among the subset select signals SSELs delayed by the delays 103 that corresponds to the subset number SSNO, and outputs the selected subset select signal. In this embodiment, since the subset select signals SSELs are generated to match the respective noncoding bits, the selector 109 outputs a noncoding bit NCB{x3}. Thus, combining the coding bits CB{x1,x2} output from the subset number generator 108 with the noncoding bit NCB{x3} output from the selector 109, a decoded signal {x1,x2,x3} is generated.

As described above, in the Viterbi decoder of this embodiment for decoding a trellis-coded modulated signal, it is possible use a general RAM for the trace-back memory. This allows for reduction in circuit size and power consumption.

Further, in this embodiment, if the number of states increases in an encoder, a circuit supporting the increase can be easily formed by only increasing the number of bits of a RAM constituting the trace-back memory. This substantially reduces the circuit area compared with the conventional case.

Moreover, in this embodiment, stored in the trace-back memory are the path select signals that depend only on the coding bits. Accordingly, if the number of subsets increases, no increase in trace-back memory is required. In the conventional configuration where the subset numbers are stored in respective nodes, the circuit size is inevitably increased in such an occurrence.

Figure 5:
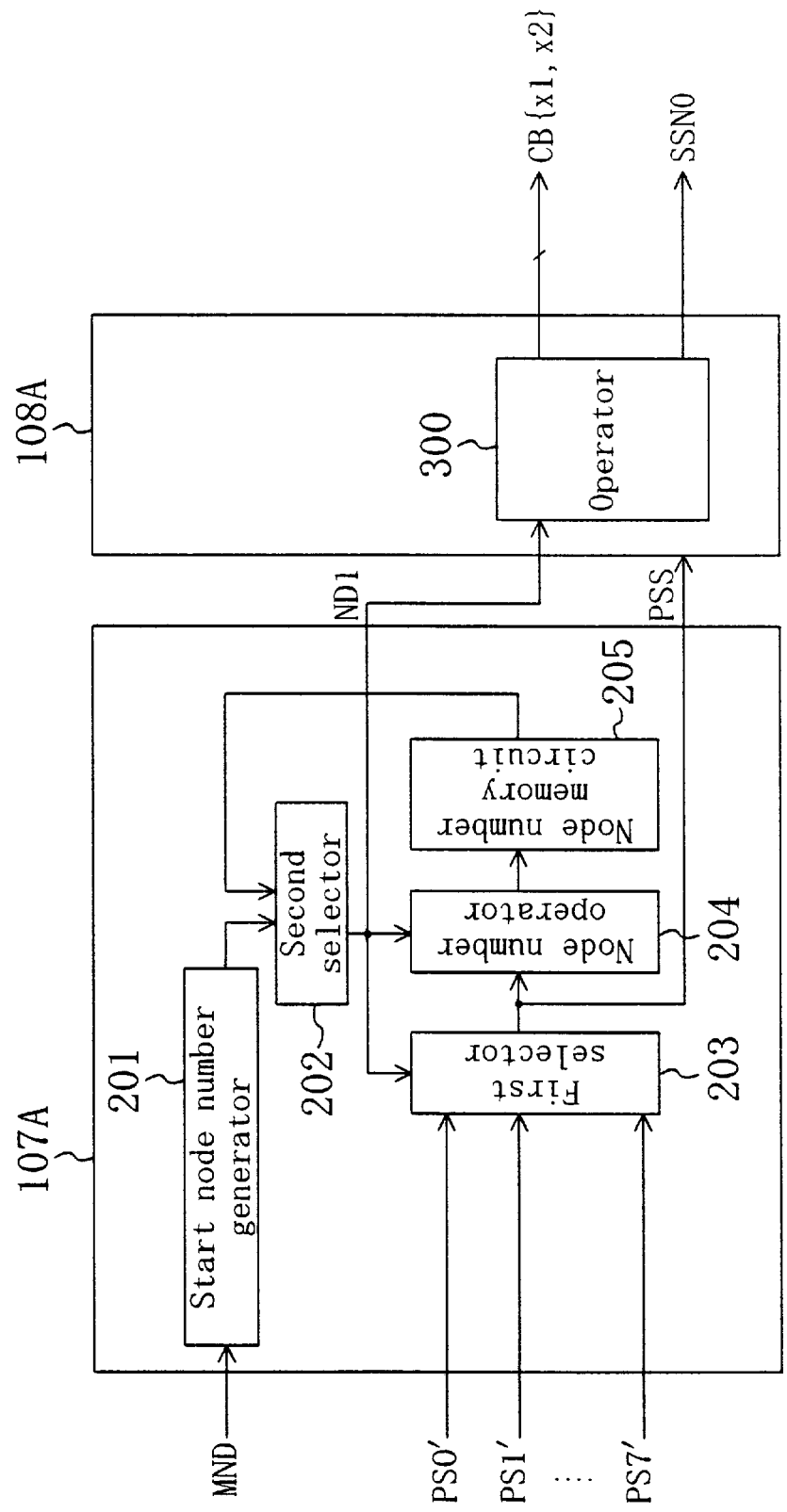
FIG. 5 is a block diagram of another example of the trace-back circuit and the subset number generator of the Viterbi decoder in FIG. 1.

FIG. 5 is a block diagram of another example of the trace-back circuit and the subset number generator. Referring to FIG. 5, a trace-back circuit 107A is the same as the trace-back circuit 107 in FIG. 2 in the basic configuration. The difference is that after the tracing back, the trace-back circuit 107A outputs, in addition to the first node number ND1 L time points earlier for the most likely path obtained as a result of the tracing back, a path select signal PSS for the first node. A subset number generator 108A includes an operator 300 in place of the ROM, for calculating the coding bits CB and the subset number SSNO from the node number ND1 and the path select signal PSS based on the generator polynomial of the encoder.

Figure 6:
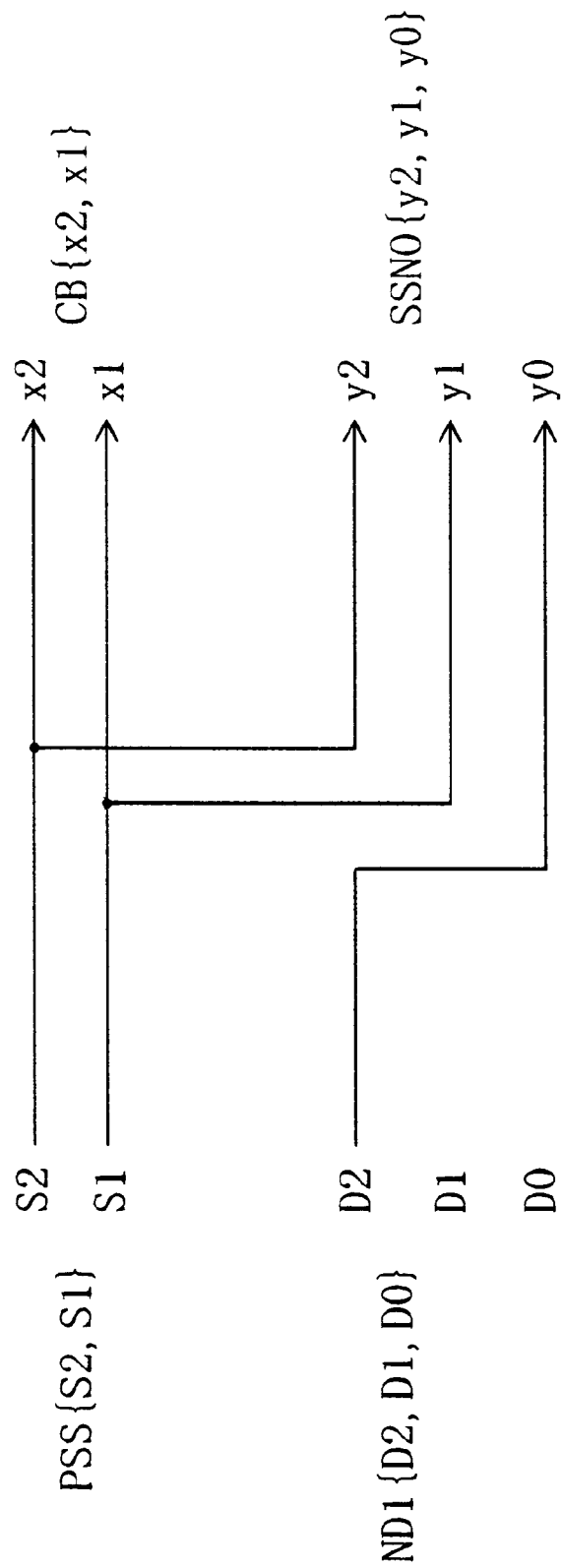
FIG. 6 illustrates an exemplary configuration of an operator shown in FIG. 5, for signals encoded by the trellis encoder in FIG. 11.

FIG. 6 illustrates a configuration of the operator 300. Since the path select signal PSS{S2,S1} matches the input coding bits {x2,x1}, the path select signal PSS{S2,S1} is directly output as the coding bits CB{x2,x1}. The subset number SSNO can be expressed as {x2,x1,D0'} using the node number one time point earlier, {D2',D1',D0'}. From equation (1) above, therefore, {S2,S1,D2(=D0')} is directly output as the subset number SSNO{y2,y1,y0}. In other words, the subset number SSNO can be obtained by simple operation of sorting the path select signal PSS and the node number ND1. It is therefore possible to implement the subset number generator 108 with such a simple operator as that shown in FIG. 6. This allows for a reduced circuit size and high-speed operation.

As in the configuration in FIG. 2, the subset number generator 108A may include a ROM storing table data representing the relationship between the combination of the node Number ND1 and the path select signal PSS and the combination of the coding bits CB and the subset number SSNO, in place of the operator 300. This increases the circuit size compared with the case of using the operator, but this makes it possible to change the configuration of the decoder depending on the encoder by merely changing the ROM.

Figure 7:
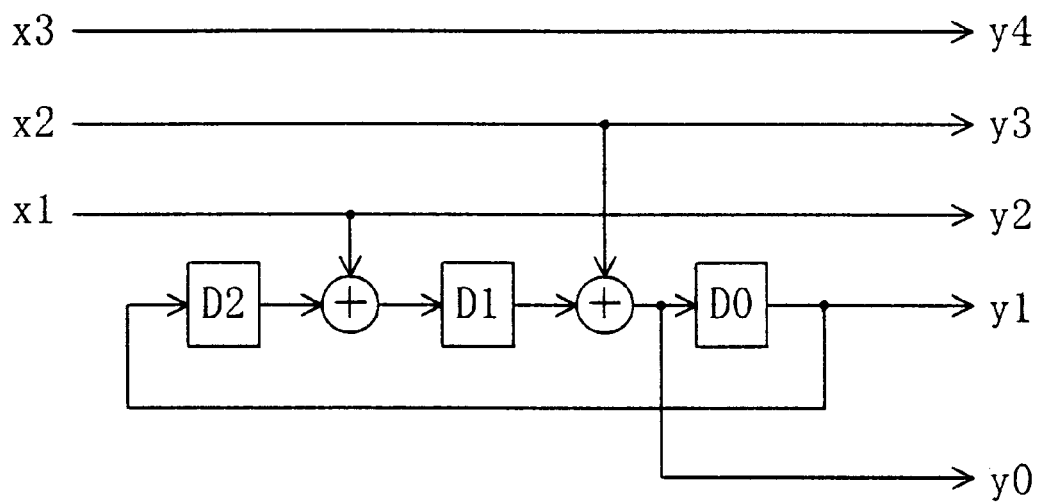
FIG. 7 illustrates an example of a trellis encoder.
Figure 8:
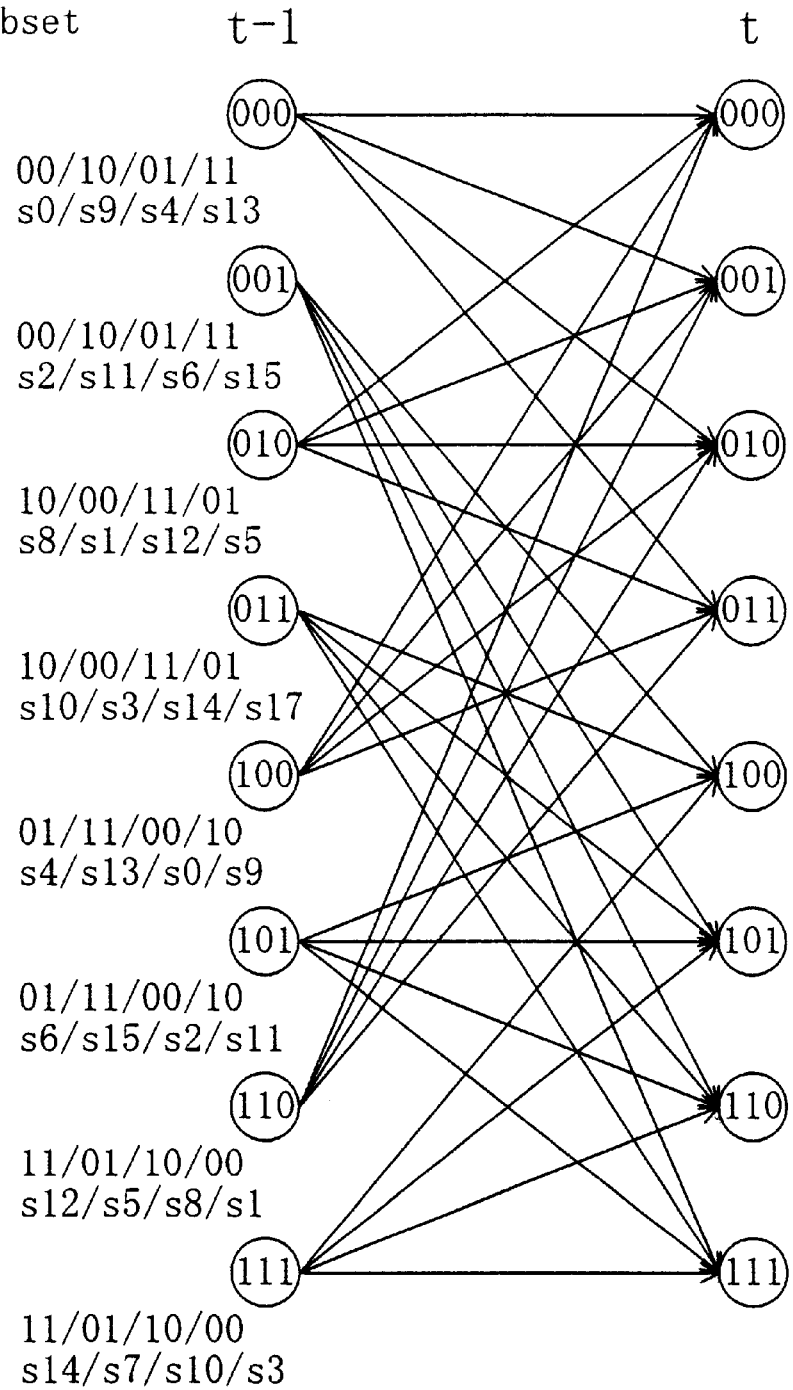
FIG. 8 is a trellis diagram for the trellis encoder in FIG. 7.

FIG. 7 illustrates another example of a trellis encoder, and FIG. 8 is a trellis diagram for the trellis encoder in FIG. 7. The trellis encoder in FIG. 7 has the number of noncoding bits k (=1), the encoding rate m/n (=⅗), and the number of subsets of 16 (=$2^{(n-k)}=2^{(5-1)}$). A signal trellis-coded modulated by the trellis encoder shown in FIG. 7 can also be decoded by a decoder having the configuration of the trace-back circuit and the subset number generator as shown in FIGS. 2 or 5. In this case, however, the table data stored in the ROM 206 or the inner configuration of the operator 300 must be changed to correspond to the trellis encoder in FIG. 7.

FIG. 9 is an example of table data stored in the ROM 206 of the subset number generator 108 in FIG. 2, prepared for signals encoded by the trellis encoder shown in FIG. 7. The table data represents the relationship between the combination of the first node Number ND1 through which the most likely path passes and the second node number ND2 through which the most likely path has passed one time point before the first node, both output from the trace-back circuit 107, and the combination of the coding bits CB{x1,x2} and the subset number SSNO (decimal notation of 4-bit string). The table data shown in FIG. 9 can be easily prepared from the trellis diagram shown in FIG. 8.

Figure 10:
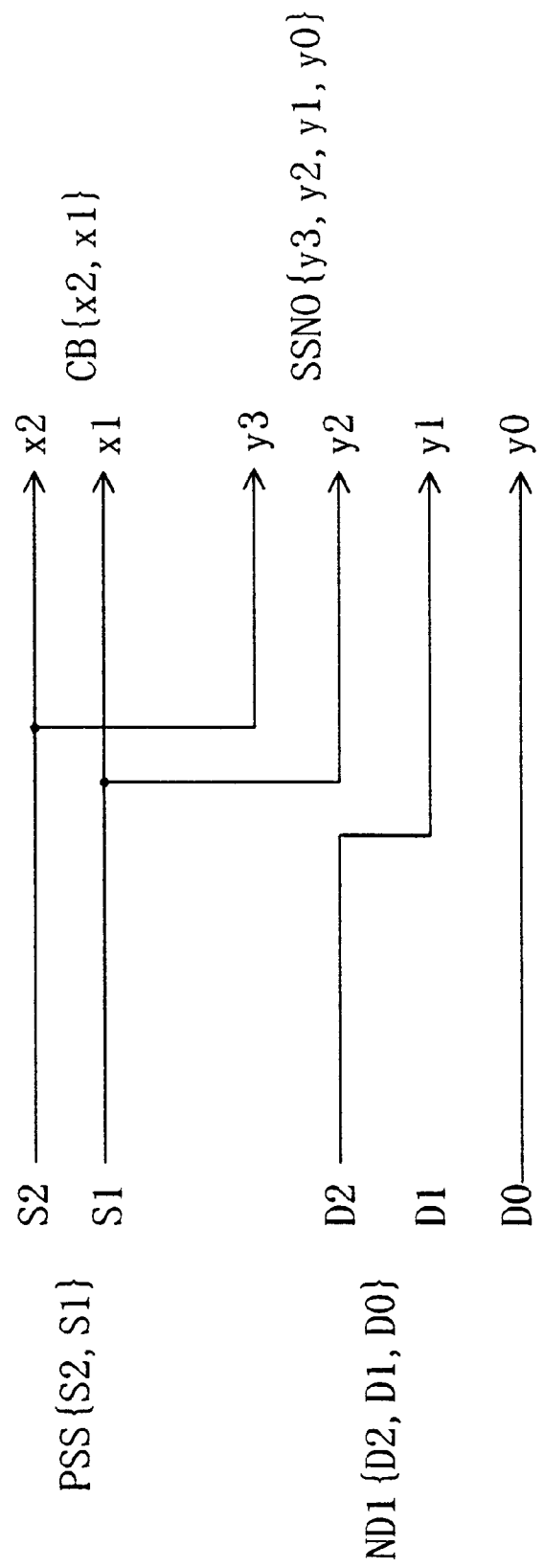
FIG. 10 illustrates another exemplary configuration of the operator in FIG. 5, for signals encoded by the trellis encoder in FIG. 7.

FIG. 10 illustrates an inner configuration of the operator 300 of the subset number generator 108A in FIG. 5, configured for signals encoded by the trellis encoder shown in FIG. 7. The operator 300 executes operation of generating the coding bits CB and the subset number SSNO (4 bits) from the first node number ND1 through which the most likely path passes and the path select signal PSS corresponding to the first node, both output from the trace-back circuit 107. Therefore, in this case, also, the subset number SSNO can be obtained by the simple operation of sorting the path select signal PSS and the node number ND1.

Alternatively, the subset number may be obtained directly by performing encoding operation as is done by the encoder using, in place of the current node number, the node number one time point earlier output from the-node number operator and the corresponding input coding bits. Otherwise, the encoding operation may be realized with table data stored in the ROM. By using table data, the configuration of the decoder can be easily changed to be usable for different encoders.

When the symbol input is comparatively slow, the tracing back processing may be performed every symbol. In this case, the start node number generator 201 desirably just passes the node number MND of the path having the currently highest likelihood output from the most likely path decision circuit 105 to the second selector 202. When the symbol input is fast, pipelined tracing back is effective. In this case, the configuration disclosed in Japanese Laid-Open Patent Publication No. 9-191258 (corresponding U.S. Pat. No. 6,041,433) may be adopted as the start node number generator 201. This will allow for substantial reduction in trace-back memory size.

In the above embodiment, the decoder was constructed by hardware. The Viterbi decoder of the present invention can also be constructed by software in the form of a program. In other words, in place of providing a Viterbi decoder, a software algorithm for implementing the Viterbi decoding method of the present invention may be provided.

As described above, in the Viterbi decoding according to the present invention, the path memory can be constructed of a trace-back memory using a general RAM. This reduces the circuit area and the power consumption of the device. This also provides easy adaptation to communication schemes using different encoders. Moreover, the circuit size is prevented from increasing even if the number of subsets generated from coding bits increases.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A Viterbi decoder for decoding a trellis-coded modulated signal, comprising:

a subset selector section for receiving a reception signal from a plurality of subsets, selecting a transmission symbol having the highest likelihood with respect to a reception symbol point for each subset, and outputting a branch metric corresponding to the selected transmission symbol and a subset select signal for specifying the selected transmission symbol;

delays for delaying the subset select signals for a predetermined time;

an add-compare-select (ACS) section for receiving the branch metrics, performing arithmetic operation to obtain path metrics in accordance with a trellis diagram, and outputting path select signals for selecting paths having high likelihood;

a trace-back memory for storing the path select signals;

a trace-back section for tracing back the path select signals stored in the trace-back memory by a predetermined trace-back length from a start node number as a start point;

a subset number generator section for outputting, using a number of a first node through which a most likely path passes obtained by the trace-back section and in accordance with a trellis diagram, coding bits relating to transition to the first node and a subset number; and a selector section for receiving the subset number and the subset select signals output from the delays and outputting a noncoding bit relating to the transition to the first node, wherein the coding bits output from the subset number generator section and the noncoding bit output from the selector section are combined to generate a decoded signal, wherein the subset number generator section generates the coding bits and the subset number using the number of the first node and a second node number through which the most likely path has passed one time point before the first node.

2. A Viterbi decoder for decoding a trellis-coded modulated signal, comprising:

a subset selector section for receiving a reception signal from a plurality of subsets, selecting a transmission symbol having the highest likelihood with respect to a reception symbol point for each subset, and outputting a branch metric corresponding to the selected transmission symbol and a subset select signal for specifying the selected transmission symbol;

delays for delaying the subset select signals for a predetermined time;

an add-compare-select (ACS) section for receiving the branch metrics, performing arithmetic operation to obtain path metrics in accordance with a trellis diagram, and outputting path select signals for selecting paths having high likelihood;

a trace-back memory for storing the path select signals;

a trace-back section for tracing back the path select signals stored in the trace-back memory by a predetermined trace-back length from a start node number as a start point;

a subset number generator section for outputting, using a number of a first node through which a most likely path passes obtained by the trace-back section and in accordance with a trellis diagram, coding bits relating to transition to the first node and a subset number; and a selector section for receiving the subset number and the subset select signals output from the delays and outputting a noncoding bit relating to the transition to the first node, wherein the coding bits output from the subset number generator section and the noncoding bit output from the selector section are combined to generate a decoded signal, and wherein the subset number generator section generates the coding bits and the subset number using the number of the first node and a path select signal corresponding to the first node.

3. A Viterbi decoder for decoding a trellis-coded modulated signal, comprising:

a subset selector section for receiving a reception signal from a plurality of subsets, selecting a transmission symbol having the highest likelihood with respect to a reception symbol point for each subset, and outputting a branch metric corresponding to the selected transmission symbol and a subset select signal for specifying the selected transmission symbol;

delays for delaying the subset select signals for a predetermined time;

an add-compare-select (ACS) section for receiving the branch metrics, performing arithmetic operation to obtain path metrics in accordance with a trellis diagram, and outputting path select signals for selecting paths having high likelihood;

a trace-back memory for storing the path select signals;

a trace-back section for tracing back the path select signals stored in the trace-back memory by a predetermined trace-back length from a start node number as a start point;

a subset number generator section for outputting, using a number of a first node through which a most likely path passes obtained by the trace-back section and in accordance with a trellis diagram, coding bits relating to transition to the first node and a subset number; and a selector section for receiving the subset number and the subset select signals output from the delays and outputting a noncoding bit relating to the transition to the first node, wherein the coding bits output from the subset number generator section and the noncoding bit output from the selector section are combined to generate a decoded signal, and wherein the ACS section generates the path select signal so that the path select signal matches the coding bits relating to the transition to a node corresponding to the path select signal.

4. A Viterbi decoding method for decoding a trellis-coded modulated signal, the method comprising the steps of:

selecting a transmission symbol having the highest likelihood with respect to a reception symbol point for each of a plurality of subsets based on a reception signal, to generate a branch metric corresponding to the selected transmission symbol and a subset select signal for specifying the selected transmission symbol;

delaying the subset select signals for a predetermined time;

performing add-compare-select (ACS) operation including receiving the branch metrics, performing arithmetic operation to obtain path metrics in accordance with a trellis diagram, and outputting path select signals for selecting paths having high likelihood;

storing the path select signals in a trace-back memory;

tracing back the path select signals stored in the trace-back memory by a predetermined trace-back length from a start node number as a start point;

generating, using a number of a first node through which a most likely path passes obtained by the tracing back and a path select signal corresponding to the first node, and in accordance with a trellis diagram, coding bits relating to transition to the first node and a subset number; and selecting a noncoding bit relating to the transition to the first node based on the subset number and the delayed subset select signals, wherein the coding bits and the noncoding bit are combined to produce a decoded signal.

* * * * *

UNITED STATES PATENT AND TRADEMARK OFFICE
CERTIFICATE OF CORRECTION

PATENT NO. : 6,654,929 B1
DATED : November 25, 2003
INVENTOR(S) : Takehiro Kamada It is certified that error appears in the above-identified patent and that said Letters Patent is hereby corrected as shown below:

Title page,
Item [56], References Cited, U.S. PATENT DOCUMENTS, add:
-- 5,509,021    04/16/1996    Todoroki --
FOREIGN PATENT DOCUMENTS, add:
-- WO 98/36500    08/20/1998    Koninkluke Philips Electronics --
OTHER PUBLICATIONS, add:
-- XP000221098    Meier S R:, A VITERBI DECODER ARCHITECTURE BASED ON PARALLEL PROCESSING ELEMENTS: Proceeding of the Global Telecommunications Conference and Exhibition(GLOBECOM), vol. 2, 2, December 1990, pp. 1323-1327, ISBN: 0-87942-632-2

XP000926968    Lin W W et al., " A TRELLIS DECODER FOR HDTV" IEEE Transactions on Consumer Electronics, IEEE Inc. New York, US, vol. 45, no. 3, August 1999, pp. 571-576 --

Signed and Sealed this

Twenty-second Day of June, 2004

JON W. DUDAS
*Acting Director of the United States Patent and Trademark Office*